United States Patent [19]

Sasayama

[11] 4,100,564
[45] Jul. 11, 1978

[54] POWER TRANSISTOR DEVICE

[75] Inventor: Takao Sasayama, Hitachi, Japan

[73] Assignee: Hitachi, Ltd., Japan

[21] Appl. No.: 750,587

[22] Filed: Dec. 15, 1976

Related U.S. Application Data

[62] Division of Ser. No. 668,433, Mar. 19, 1976, abandoned.

[30] Foreign Application Priority Data

Apr. 4, 1975 [JP] Japan .................................. 50-40270

[51] Int. Cl.² .......................................... H01L 27/02
[52] U.S. Cl. ...................................... 357/46; 357/34; 357/40; 357/55
[58] Field of Search ...................... 357/46, 34, 40, 55

[56] References Cited

U.S. PATENT DOCUMENTS 3,836,997   9/1974   Binthoven et al. .................... 357/46

Primary Examiner—Edward J. Wojciechowicz
Attorney, Agent, or Firm—Craig & Antonelli

[57] ABSTRACT

A power transistor device having a circuit provided with first, second, third and fourth transistors, wherein the first and the second transistors are connected in the Darlington configuration while the third and the fourth transistors are connected respectively between the base and the emitter of the first transistor and between the base and the emitter of the second transistor, so as to release the residual charges in the first and the second transistors therethrough by being rendered conductive in response to the inputs thereto.

4 Claims, 6 Drawing Figures

POWER TRANSISTOR DEVICE

This is a division of application Ser. No. 668,433 filed Mar. 19, 1976, now abandoned.

This invention relates to a semiconductor device and more particularly to a Darlington-connected transistor circuit, which is specifically adapted to switching on and off a large current at high speed.

A gate-turn-off type thyristor or a Darlington-connected transistor circuit is conventionally known and used as a semiconductor switch which can effect the on-off operation of a circuit through which a large current above several amperes flows in response to a small signal. Although the gate-turn-off type thyristor has an advantage that no power to maintain its conductive or non-conductive state is needed, it requires current pulses of opposite polarities to be applied to its gate in order to ignite and extinguish it respectively. Hence, an additional complicated control circuit must be used when the gate-turn-off type thyristor is applied to such a system having a single dc power source as ignition circuit in an automobile. Moreover, a small current gain for turn-off and the high forward voltage drop due to its four-layer configuration with the resultant power loss become serious problems in such a gate-turn-off type thyristor. On the other hand, the Darlington-connected transistor circuit needs a driving power for maintaining its conductive state and the dc current amplification factor must be increased to decrease the driving power. In the Darlington amplifier, the overall dc current amplification factor is given by the product of the respective amplification factors of the component transistors so that the overall factor can be made large. In this case, however, the overall amplification factor cannot be made arbitrarily large in view of charge releasing time. Here are inconsistant problems in design. For example, if it is required to swiftly release the charge having been accumulated between the base and emitter of a transistor, a resistor having as small a resistance as possible should be connected between the base and emitter of the transistor. If it is required to make the current amplification factor of the transistor large, on the other hand, the resistor must have a large resistance, because a current leaks through the short-circuit with such a small resistance between the base and emitter and the current amplification factor is reduced to a fatal extent.

The above-mentioned problem of the Darlington-connected transistor circuit arises from the provision of resistors in the paths for releasing base carriers and, therefore, if semiconductor switching elements such as switching transistors are used to release the base carriers, the problem will be solved. This is the main conception of this invention. Moreover, according to this invention, the transistor switches to attain the above purpose can be fabricated simultaneously in the process of forming the Darlington-connected transistor circuit.

It is therefore one object of this invention to provide a power transistor circuit having a high current amplification factor.

Another object of this invention is to provide a power transistor circuit having a swift turn-off action.

According to one aspect of the present invention there is provided a power transistor device comprising an N-type substrate, an $N^+$-type layer formed in one main surface of said N-type substrate, a first and a second P-type layer formed in the other main surface of said N-type substrate, a first and a second N-type layer formed respectively in said first and second P-type layers, a means for electrically connecting said second P-type layer with said second N-type layer formed in said first P-type layer, and a third and a fourth N-type layer formed respectively in said first and second P-type layers.

According to another aspect of the present invention there is provided a semiconductor device comprising a first and a second transistor connected in Darlington circuit, wherein a first semiconductor switching means is connected between the base and emitter of said first transistor and a second semiconductor switching means is connected between the base and emitter of said second transistor.

Other objects and effects of this invention will become clear from the following description of this invention and the attached drawings.

This invention will be described below by way of embodiment with the aid of the attached drawings, in which.

Figure 1:
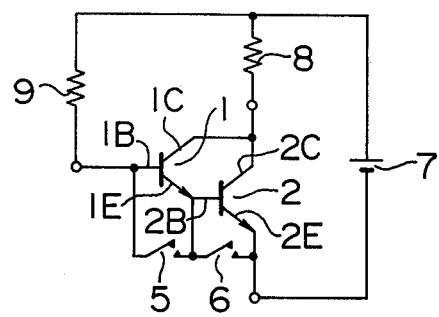
FIG. 1 is an electric wiring diagram useful for explaining the operational principle of the Darlington-connected transistor circuit according to this invention.

In FIG. 1 showing the circuit useful for explaining the principle of this invention, a load resistor 8 is connected between the collector 2C of a transistor 2 and the positive electrode of a dc power source 7 while a resistor 9 for supplying a bias current is connected between the base 1B of a transistor 1 and the positive pole of the dc source 7, and the emitter 2E of the transistor 2 is connected with the negative pole of the power source 7. The respective collectors 1C and 2C of the transistors 1 and 2 are connected with each other and the emitter 1E of the transistor 1 is connected with the base 2B of the transistor 2. Switches 5 and 6 are connected respectively between the base and emitter of the transistor 1 and between the base and emitter of the transistor 2.

With this structure, when the switches 5 and 6 are open, the conduction path is established between the emitter 2E and the collector 2C of the transistor 2 due to the base driving bias current flowing through the closed path from the power source 7 to the resistor 9 to the base 1B of the transistor 1 to the emitter 1E of the transistor 1 to the base 2B of the transistor 2 to the emitter 2E of the transistor 2 and then to the power source 7, so that a load current flows through the closed path from the power souce 7 source the resistor 8 to the collector 2C of the transistor 2 to the emitter 2E of the transistor 2 and then to the power source 7. In this operation, the base driving bias current can be reduced to a value equal to the value of the desired load current divided by the product of the dc current amplification factors of the transistors 1 and 2.

If the switches 5 and 6 are both closed just after the base current into the transistor 1 has been interrupted, the residual carriers in the respective base layers 1B and 2B of the transistors 1 and 2 are released through the switches 5 and 6 and vanish. The transistors 1 and 2 with their bases short-circuited with their emitters are then cut off even in their steady state.

In this way, the effective reduction in the dc current amplification factor due to the diverting current through the resistors used in place of the switches 5 and 6 in the conventional Darlington circuit can be prevented during the driving operation and the time required for the residual charges to vanish through the short-circuits can be shortened in the transient time of the cut off state.

Figure 2:
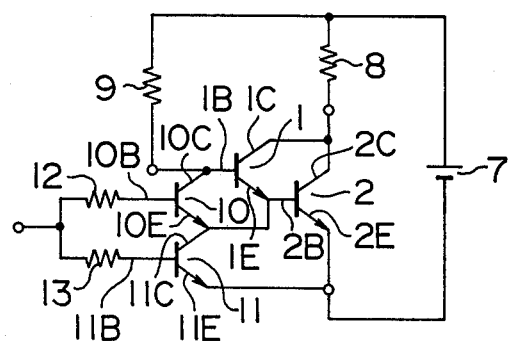
FIG. 2 is an electric wiring diagram of the Darlington-connected transistor circuit as an embodiment of this invention.

FIG. 2 is an electric wiring diagram of a Darlington circuit as an embodiment of this invention. The equivalent circuit elements are indicated by the same reference symbols throughout the figures. The outstanding feature of this circuit is the provision of two transistors 10 and 11 in place of the switches 5 and 6 in the basic circuit in FIG. 1. The collector 10C of the transistor 10 is connected with the base 1B of the transistor 1, the emitter 10E of the transistor 10 with the emitter 1E of the transistor 1, the collector 11C of the transistor 11 with the base 2B of the transistor 2, and the emitter 11E of the transistor 11 with the emitter 2E of the transistor 2. Resistors 12 and 13 are connected at their one ends respectively with the bases 10B and 11B of the transistors 10 and 11 and the remaining ends of the resistors 12 and 13 are connected with each other.

With this structure, if a predetermined voltage is applied to the junction point of the resistors 12 and 13, a current is supplied to the base 11B of the transistor 11 through the resistor 13, to render the transistor 11 conductive. Then, the transistor 10 turns conductive due to the current flowing through the resistor 12, the base 10B and the emitter 10E of the transistor 10, and the collector 11C and the emitter 11E of the transistor 11. Thus, the base and the emitter of the transistor 1 are short-circuited by the transistor 10, and the base and the emitter of the transistor 2 by the transistor 11. If the voltage applied to the junction point of the resistors 12 and 13 is removed, the driving current through the transistors 10 and 11 is interrupted and therefore the short-circuiting paths are broken. Accordingly, the circuit in FIG. 2 becomes identical with the circuit in FIG. 1 with its switches 5 and 6 open. In the circuit shown in FIG. 2, the switches, i.e. transistors 10 and 11, can be simultaneously opened and closed so that the principle explained with the circuit in FIG. 1 can also be attained by this circuit in FIG. 2.

The construction of the circuit in FIG. 2 with discrete circuit elements will make the production cost rather high and the resultant circuit too complex to be used freely.

Figure 3:
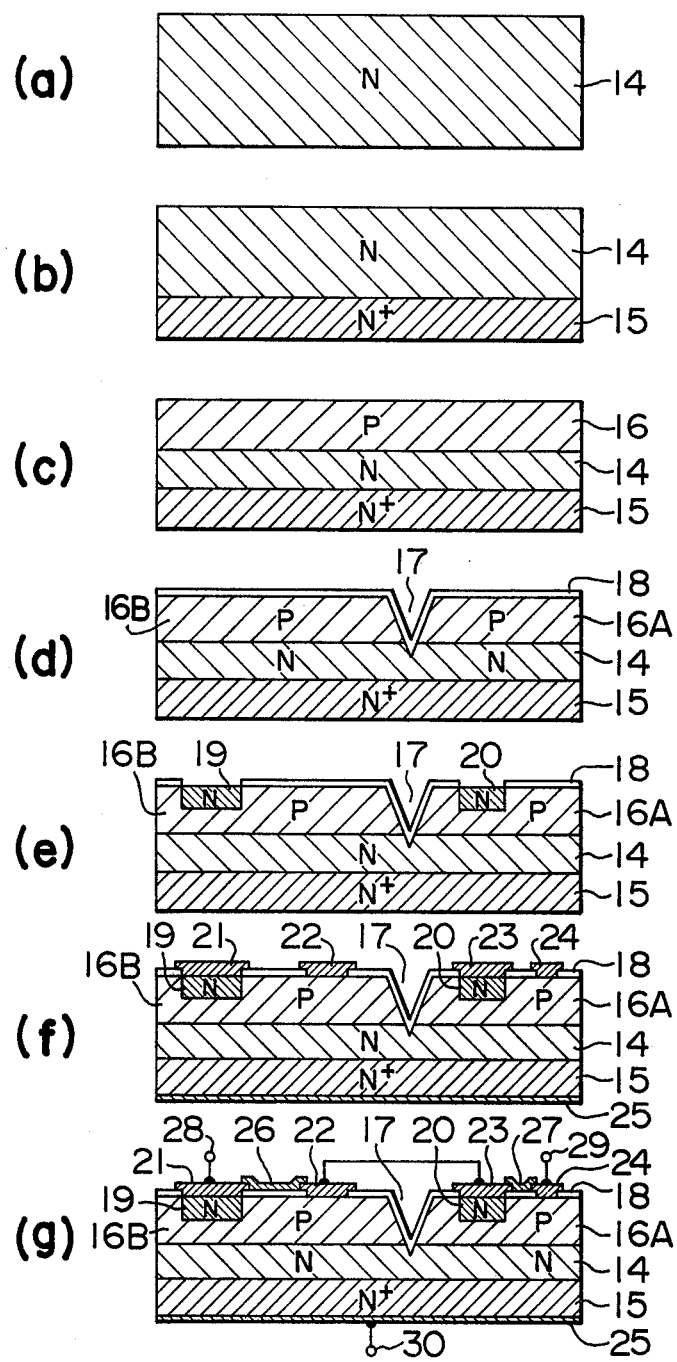
FIG. 3 shows the steps of process for fabricating a conventional Darlington circuit.
Figure 4:
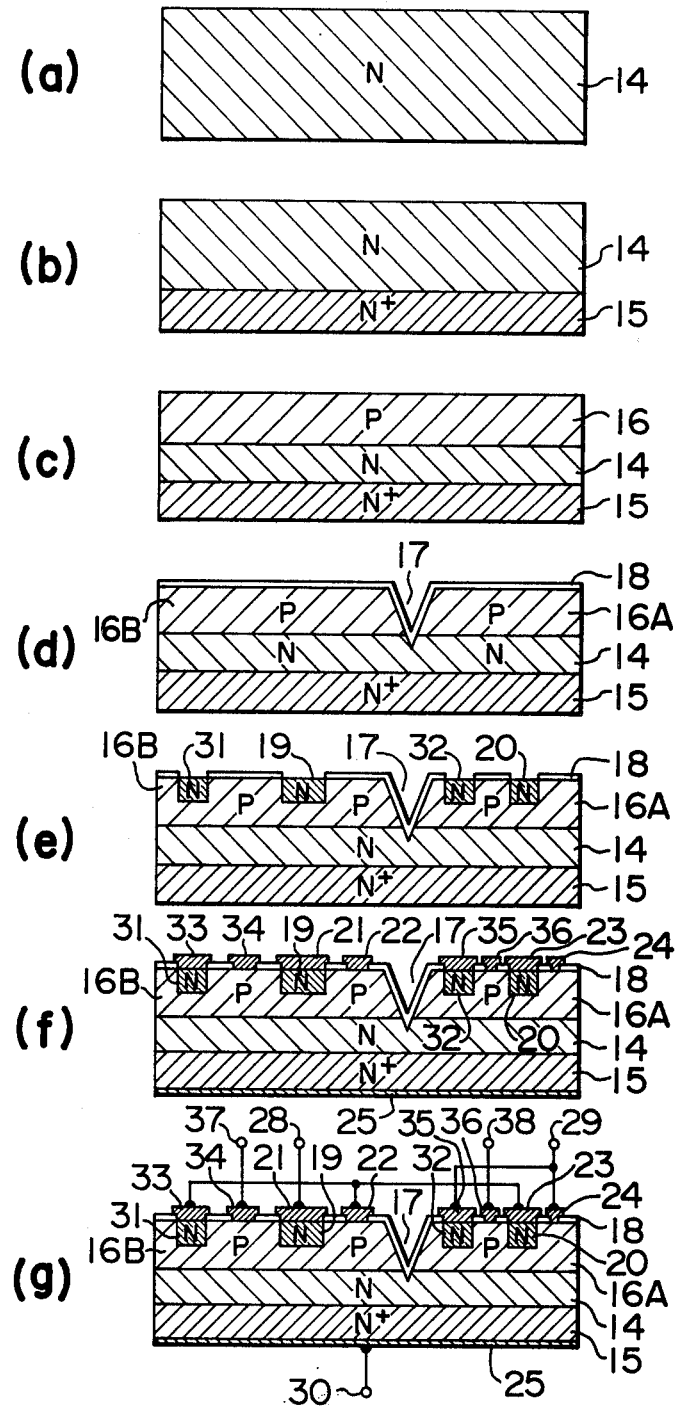
FIG. 4 shows the steps of process for fabricating the Darlington circuit according to this invention.

FIGS. 3 and 4 show the steps of the processes for producing composite solid-state circuits which can be free from the above drawbacks. FIG. 3 shows the steps of the process for fabricating a conventional solid-state Darlington circuit and FIG. 4 shows the steps of the process for fabricating a composite solid-state transistor switching circuit according to this invention. The steps (a), (b), (c) and (d) shown in the respective FIG. 3 and FIG. 4 are identical with each other and therefore explained commonly.

In the step (a) shown in each of FIGS. 3 and 4, an N-type substrate 14 of, for example, silicon Si to serve as a support of the solid-state circuit to be fabricated, is prepared.

In the step (b) shown in each of FIGS. 3 and 4, an N+-type layer 15 is formed in the substrate 14, by doping N-type impurity by means of, for example, diffusion.

In the step (c) shown in each of FIGS. 3 and 4, a P-type layer 16 is formed in the substrate 14 by doping P-type impurity by means of, for example, diffusion.

In the step (d) of each of FIGS. 3 and 4, a groove 17 whose bottom reaches the inside of the N-type layer 14 is cut on the side of the P-type layer 16 to split the P-type layer 16 into its parts 16A and 16B. Thereafter, a SiO₂ film 18 is formed by means of surface oxidation. The SiO₂ film serves not only as an electrically insulating layer but as a protective film.

The steps (e), (f) and (g) shown in FIG. 3 and the steps (e), (f) and (g) shown in FIG. 4 are the same in chemical treatment but different from each other in pattern formation. First, the description will be made of the production process and the operation of the conventional Darlington circuit referring to FIG. 3.

In the step (e) of FIG. 3 a part of the SiO₂ film 18 is removed by means of, for example, photoresist method or chemical etching and N-type layers 19 and 20 are simultaneously formed by diffusing N-type impurity.

In the step (f) of FIG. 3, aluminum electrodes 21 to 25 are formed on predetermined positions by means of vacuum deposition using masking.

In the step (g) of FIG. 3, the electrodes 22 and 23 are connected by a lead conductor and the electrodes 21, 24 and 25 are provided respectively with an emitter terminal 28, a base terminal 29 and a collector terminal 30. Also, by means of vacuum deposition using masking are formed a resistor layer 26 between the electrodes 21 and 22 and a resistor layer 27 between the electrodes 23 and 24.

With this structure, two NPNN+-type transistors in longitudinal disposition, divided by the groove 17, are connected in Darlington configuration. The transistors share the N+ layer 15 as their collector region. The part on the right-hand side of the groove 17 in the drawing corresponds to the transistor 1 in FIG. 1 and the part on the left-hand side of the groove 17 in the drawing to the transistor 2 in FIG. 1. The N layer 20 and the P layer 16A serve respectively as the emitter 1E and the base 1B. The N layer 19 and the P layer 16B serve respectively as the emitter 2E and the base 2B. As described above, the emitter 1E and the base 2B are connected with each other by a lead conductor. In this way, the transistors are in the Darlington configuration. The resistive layers 27 and 28 are formed respectively between the bases and the emitters of the transistors and function, in place of the switches 5 and 6 of FIG. 1, to release the residual charges.

If a voltage is duly applied between the base terminal 29 of one transistor and the emitter terminal 28 of the other, minority carriers (i.e. electrons in this case) are injected into the base layers 16A and 16B of the transistors so that amplified currents flow toward the emitters 19 and 20 through the reverse-biased base-collector PNN+ junctions (16A-14-15, 16B-14-15). Thus, the function similar to that of an ordinary transistor can be performed.

Now, the production process and the operation of the semiconductor device according to this invention will be described.

In the step (e) of FIG. 4, N-type layers 19, 20, 31 and 32 are simultaneously formed by means of the diffusion of N-type impurity.

In the step (f) of FIG. 4, four parts of the SiO$_2$ film are removed to form electrodes 22, 24, 34 and 36 on the P layers 16A and 16B. Moreover, electrodes 21, 23, 33, 35 and 25 are formed respectively on the N layers 19, 20, 31 and 32 and the N$^+$ layer 15.

In the step (g) of FIG. 4, the electrodes 33, 22 and 23 are connected with one another by a lead and the electrodes 35 and 24 are connected with each other by another lead wire. The electrodes 21, 24, 34, 36 and 25 are provided respectively with an emitter terminal 28, a base terminal 29, a second base terminal 37, a second base terminal 38 and a collector terminal 30.

With this structure, in addition to the two four-layer NPNN$^+$ transistors (20-16A-14-15, 19-16B-14-15) corresponding to the transistors 1 and 2 in FIG. 1, the N layer 32 formed on the P layer 16A and the electrode 36 formed on the P layer 16A between the N layers 20 and 32 form a lateral type transistor together with the N layer 20, and the N layer 31 and the electrode 34 form another lateral type transistor together with the N layer 19.

Namely, the lateral transistor consisting of the layers 32-16A-20 and the transistor corresponding to transistor 1 share the emitter region 20, this lateral transistor being the transistor 10 in FIG. 2. The lateral transistor consisting of the layers 31-16B-19 and the transistor corresponding to transistor 2 share the emitter-region 19, this lateral transistor being the transistor 11 in FIG. 2. The N layers 32 and 31 are respectively the collectors of the transistors 10 and 11. The N layer 32 is connected with the base of the transistor 1 while the N layer 31 and the base of the transistor 2 are connected with each other. The thus formed structure is represented by the circuit shown in FIG. 2. The electrodes 36 and 34 correspond respectively to 10B and 11B in FIG. 2 and are provided with the second and third base terminals 37 and 38. In the step (g) of FIG. 4, the terminals 37 and 38 are shown as external ones, but another artifice may be devised. For example, a resistive film may be formed by means of vacuum evaporation on a portion of the SiO$_2$ film 18, which film connects the terminal 37 with the terminal 38, and a lead-out terminal may be provided at the middle point of the resistive film. In that case, the complete circuit shown in FIG. 2 can be produced according to the process for integrally fabricating a conventional Darlington circuit.

Figure 5A:
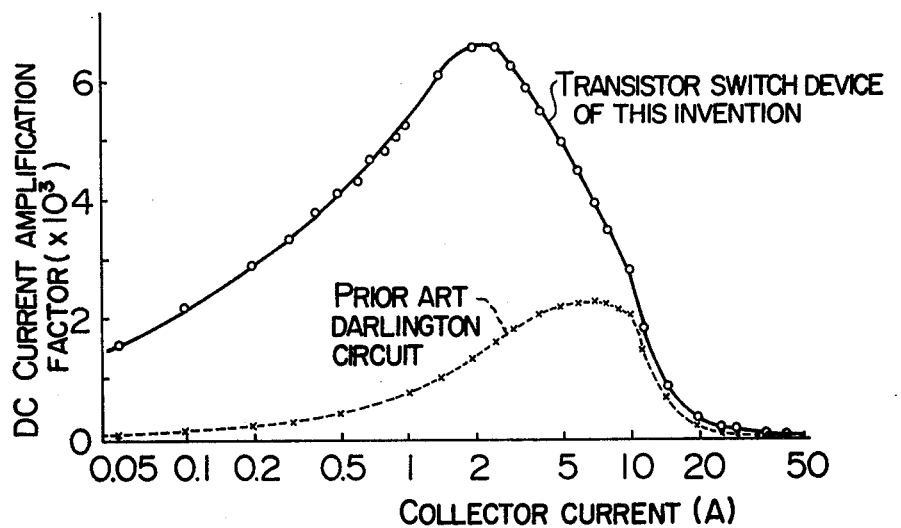
FIGS. 5A and 5B show in comparison the characteristics of the Darlington circuits of the prior art and of this invention.
Figure 5B:
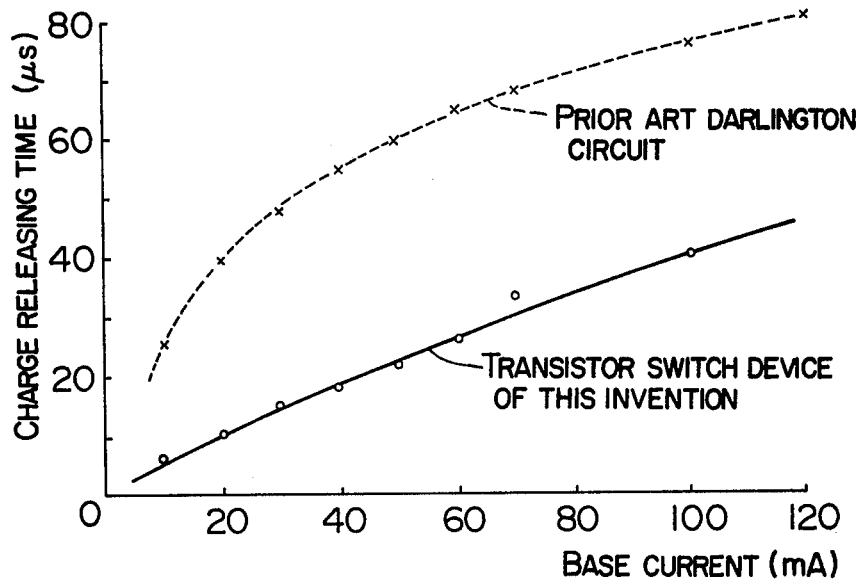

FIGS. 5A and 5B show in comparison characteristics of the semiconductor devices shown in the respective final steps (e) of FIGS. 3 and 4, FIG. 5A showing the dc current amplification factor varying with collector current and FIG. 5B illustrating the charge releasing time varying with base current, in switching operation at a high collector current (6A).

As seen from FIGS. 5A and 5B, the dc current amplification factor of the device according to this invention is much improved in comparison with that of the conventional device while charge releasing time which largely influences the switching speed, is exceedingly shorter in this invention than in the conventional device. Moreover, since the device according to this invention has a large dc current amplification factor, a certain collector current can be switched on and off by a smaller base current than that is required by the conventional device to control the same collector current. This means that the charge releasing time can be further reduced.

In the above description of the embodiment of this invention, the respective paths between the bases and emitters of the first and second transistors are switched on and off simultaneously by bipolar transistors, but the bipolar transistor may be replaced by field effect transistors which have a merit of large input impedance.

According to this invention, the residual carriers in the base regions swiftly vanish since the base-emitter biases of the transistors in Darlington connection can be positively changed over, and a high current amplification factor can be attained since the base-emitter bypasses are broken during the conductive period.

According to this invention, the transistor switch having desired characteristics can be obtained without any new production step and the associated increase in cost since as seen from FIGS. 3 and 4 the present process is similar to a conventional one, except mere details.

As seen in the embodiment shown in FIGS. 2 and 4, NPN transistors are used as switches for removing the accumulated charges in the Darlington circuit. A high-speed switch using a Darlington circuit is used, for example, to control the primary current to the ignition device of a car. The power source for a car is usually a unidirectional-current source with its negative pole grounded. And the circuit in which the bases and emitters of the first and second transistors in Darlington connection are short-circuited by NPN transistors, is very easy to control since the NPN transistors are operated when a given positive voltage is applied to the bases.

What is claimed is:

1. A power transistor device comprising:
   an N-type substrate having two main surfaces;
   an N$^+$-type layer formed in one of said two main surfaces of said N-type substrate;
   a first and a second P-type layer formed in the other main surface of said N-type substrate, said first and second P-type layers being electrically isolated from each other;
   a first and a second N-type layer formed respectively in said first and second P-type layers, said first N-type layer acting as an emitter for said first P-type layer and said N-type substrate, said second N-type layer acting as an emitter for said second P-type layer as well as said N-type substrate, respectively;
   a third N-type layer formed in said first P-type layer, said third N-type layer acting as a collector for said first N-type layer and being spaced apart from said first N-type layer by a portion of said first P-type layer between said first and third N-type layers;
   means for electrically connecting said first P-type layer to said third N-type layer;
   a fourth N-type layer formed in said second P-type layer and being non-contiguous with said second N-type layer by a predetermined portion of said second P-type layer between said fourth and second N-type layers; and
   means for electrically connecting said first N-type layer, said second P-type layer, and said fourth N-type layer to each other.

2. A power transistor device comprising:
   an N-type substrate having two main surfaces;
   an N$^+$-type layer formed in one of said two main surfaces of said substrate;
   a first electrode on said N$^+$-type layer;
   a first and a second P-type layer formed in the other main surface of said substrate;

a first and a second N-type layer formed in said first P-type layer;

a second and a third electrode provided on said first P-type layer, said third electrode being disposed between said first and second N-type layers;

a third and a fourth N-type layer formed in said second P-type layer, said third and fourth N-type layers being non-contiguous with each other;

a fourth and a fifth electrode provided on said second P-type layer, said fifth electrode being disposed between said third and fourth N-type layers;

a connecting means for electrically connecting said second electrode with said second N-type layer; and a connecting means for electrically connecting said first N-type layer, said fourth electrode and said fourth N-type layer with one another.

3. A semiconductor device comprising:

an $N^+$-type layer with its one main surface connected with a collector electrode;

an N-type layer in contact with the other main surface of said $N^+$-type layer;

a first and a second P-type layer in contact with said N-type layer;

means for electrically isolating said first P-type layer from said second P-type layer;

a first N-type layer formed in said first P-type layer;

a second N-type layer formed in said second P-type layer;

a third and a fourth N-type layer formed respectively in said first and second P-type layers, said fourth layer being non-contiguous with said second N-type layer;

a first connecting means for electrically connecting said first P-type layer with said third N-type layer; and a second connecting means for electrically connecting said first N-type layer, said second P-type layer, and said fourth N-type layer.

4. A power transistor device comprising:

a semiconductor substrate of a first conductivity type having first and second opposite surfaces;

a first semiconductor layer of said first conductivity type but having a higher impurity concentration than said substrate formed on said first surface of said substrate;

second and third semiconductor layers of a second conductivity type, opposite said first conductivity type, disposed on said second surface of said substrate and being electrically isolated from each other;

fourth and fifth non-contiguous semiconductor layers of said first conductivity type disposed in respective surface portions of said second semiconductor layer spaced apart from each other by the semiconductor material of said second semiconductor layer therebetween;

a first vertical transistor being thus formed with said fourth semiconductor layer as its emitter, said second semiconductor layer as its base, and said substrate as its collector;

a first lateral transistor being thus formed with said fourth semiconductor layer as its emitter, said second semiconductor layer as its base, and said fifth semiconductor layer as its collector;

sixth and seventh non-contiguous semiconductor layers of said first conductivity type disposed in respective surface portions of said third semiconductor layer spaced apart from each other by the semiconductor material of said third semiconductor layer therebetween;

a second vertical transistor being formed with said sixth semiconductor layer as its emitter, said third semiconductor layer as its base, and said substrate as its collector;

a second lateral transistor being formed with said sixth semiconductor layer as its emitter, said third semiconductor layer as its base, and said seventh semiconductor layer as its collector;

first electrode means for electrically connecting said second semiconductor layer to said fifth semiconductor layer;

second electrode means for electrically connecting said third semiconductor layer to said fourth and seventh semiconductor layers;

first and second base electrodes respectively disposed in contact with those portions of said second and third semiconductor layers, respectively, by way of which said fourth and fifth semiconductor layers and said sixth and seventh semiconductor layers are spaced apart from each other.

* * * * *